(12) United States Patent
Nadig

(10) Patent No.: US 11,101,638 B2
(45) Date of Patent: Aug. 24, 2021

(54) SEMICONDUCTOR DIE INCLUDING MULTIPLE CONTROLLERS FOR OPERATING OVER AN EXTENDED TEMPERATURE RANGE

(71) Applicant: Analog Devices Global Unlimited Company, Hamilton (BM)

(72) Inventor: Rajiv Nadig, Bengaluru (IN)

(73) Assignee: Analog Devices Global Unlimited Company, Hamilton (BM)

( * ) Notice: Subject to any disclaimer, the term of this patent is extended or adjusted under 35 U.S.C. 154(b) by 328 days.

(21) Appl. No.: 16/153,496

(22) Filed: Oct. 5, 2018

(65) Prior Publication Data
US 2020/0112165 A1 Apr. 9, 2020

(51) Int. Cl.
| | |
|---|---|
| *H02H 5/04* | (2006.01) |
| *H02H 1/00* | (2006.01) |
| *H01L 23/34* | (2006.01) |
| *H01L 27/02* | (2006.01) |
| *H02H 3/08* | (2006.01) |

(52) U.S. Cl.
CPC ............. *H02H 5/044* (2013.01); *H01L 23/34* (2013.01); *H01L 27/0211* (2013.01); *H02H 1/0007* (2013.01); *H02H 1/0023* (2013.01); *H02H 3/085* (2013.01)

(58) Field of Classification Search
CPC .... H02H 5/044; H02H 1/0007; H02H 1/0023; H02H 3/085; H01L 23/34; H01L 27/0211
See application file for complete search history.

(56) References Cited

U.S. PATENT DOCUMENTS

| | | |
|---|---|---|
| 7,006,943 B1 | 2/2006 | Mitchell et al. |
| 7,263,567 B1 | 8/2007 | Subramaniyam et al. |
| 7,584,369 B2 | 9/2009 | Capps, Jr. et al. |
| 7,613,855 B2 | 11/2009 | Phillips et al. |
| 7,706,929 B2 | 4/2010 | Chiu |

(Continued)

FOREIGN PATENT DOCUMENTS

| | | |
|---|---|---|
| DE | 10 2008 043 948 | 7/2009 |
| WO | WO 2017-084840 | 5/2017 |

OTHER PUBLICATIONS

Intel Atom Processor C2000 Product Family for Microserver Datasheet; Jan. 2016; 745 pages.

(Continued)

*Primary Examiner* — Kyle J Moody
(74) *Attorney, Agent, or Firm* — Knobbe, Martens, Olson & Bear, LLP

(57) ABSTRACT

Provided herein are semiconductor dies including multiple controllers for operating over an extended temperature range. In certain embodiments, a semiconductor die includes multiple circuit modules, a temperature sensor that generates a detected temperature signal, an interface that communicates with an external host, a primary controller coupled to the interface and operable to control the circuit modules, and a secondary controller coupled to the interface. In response to the detected temperature signal indicating that the temperature of the semiconductor die exceeds a threshold temperature, the primary controller enables the secondary controller, which in turn disables the primary controller and at least a portion of the plurality of circuit modules to reduce heat dissipation.

20 Claims, 7 Drawing Sheets

(56) References Cited

U.S. PATENT DOCUMENTS

| | | | |
|---|---|---|---|
| 7,865,751 B2 | 1/2011 | Monferrer et al. | |
| 8,742,622 B2* | 6/2014 | Richards, III | H02M 1/32 |
| | | | 307/80 |
| 8,874,839 B2 | 10/2014 | Chiu | |
| 9,450,501 B2 | 9/2016 | Inomata | |
| 9,823,629 B2 | 11/2017 | Kuprijanov et al. | |
| 10,224,816 B2* | 3/2019 | Mirjafari | H02M 1/32 |
| 2002/0118001 A1* | 8/2002 | Duffy | H02M 3/1584 |
| | | | 323/283 |
| 2006/0061339 A1 | 3/2006 | Lewis et al. | |
| 2008/0082242 A1 | 4/2008 | Dell'Eva et al. | |
| 2008/0228959 A1 | 9/2008 | Wang | |
| 2010/0033237 A1* | 2/2010 | Liang | H03K 17/6871 |
| | | | 327/543 |
| 2010/0102790 A1* | 4/2010 | Buterbaugh | H02M 3/285 |
| | | | 323/283 |
| 2011/0025292 A1* | 2/2011 | Huang | H02M 3/1584 |
| | | | 323/318 |
| 2011/0051479 A1* | 3/2011 | Breen | H02M 3/1584 |
| | | | 363/148 |
| 2011/0099395 A1* | 4/2011 | Richards, III | G06F 1/28 |
| | | | 713/310 |
| 2011/0226462 A1* | 9/2011 | Sato | G05D 23/1931 |
| | | | 165/247 |
| 2011/0234000 A1* | 9/2011 | Yan | H02M 3/157 |
| | | | 307/31 |
| 2013/0154143 A1 | 6/2013 | Wallinger et al. | |
| 2014/0060773 A1 | 3/2014 | Wajima | |
| 2014/0312857 A1* | 10/2014 | Zheng | H02M 3/1584 |
| | | | 323/234 |
| 2014/0365793 A1 | 12/2014 | Cox et al. | |
| 2015/0207400 A1* | 7/2015 | Shenoy | H02M 3/1584 |
| | | | 323/213 |
| 2016/0349773 A1 | 12/2016 | Borowicz et al. | |
| 2017/0006089 A1 | 1/2017 | Felteau | |
| 2017/0220193 A1 | 8/2017 | Sauer et al. | |
| 2020/0236824 A1* | 7/2020 | Odashima | H05K 7/20945 |

OTHER PUBLICATIONS

Intel 6th Generation Intel Processor Families for S-Platforms Datasheet; vol. 1 of 2; May 2018; 165 pages.

* cited by examiner

SEMICONDUCTOR DIE INCLUDING MULTIPLE CONTROLLERS FOR OPERATING OVER AN EXTENDED TEMPERATURE RANGE

FIELD OF THE DISCLOSURE

Embodiments of the invention relate to electronic systems, and more particularly, to semiconductor dies including controllers.

BACKGROUND

Certain semiconductor dies or chips, such as those used in system-on-a-chip (SoC) applications, are designed to operate over a particular temperature range. When the temperature of the die is outside of the temperature range, numerous problems can result, such as functional inoperability and/or increased levels of power consumption. Moreover, high levels of power consumption can lead to a further increase in temperature, which can lead to chip damage and/or decreased reliability.

SUMMARY OF THE DISCLOSURE

Provided herein are semiconductor dies including multiple controllers for operating over an extended temperature range. In certain embodiments, a semiconductor die includes multiple circuit modules, a temperature sensor that generates a detected temperature signal, an interface that communicates with an external host, a primary controller coupled to the interface and operable to control the circuit modules, and a secondary controller coupled to the interface with a limited control of the circuit modules. In response to the detected temperature signal indicating that the temperature of the semiconductor die exceeds a threshold temperature, the primary controller enables the secondary controller, which in turn disables the primary controller and at least a portion of the plurality of circuit modules to reduce heat dissipation. The secondary controller communicates status information to the external host over the interface. In response to the detected temperature signal indicating that the temperature of the semiconductor die has dropped below the threshold temperature, the secondary controller enables the primary controller, which in turn disables the secondary controller and restores the plurality of circuit modules to normal operation.

In one aspect, a semiconductor die supporting signaling and control over a wide temperature range is provided. The semiconductor die includes a plurality of circuit modules, a temperature sensor configured to generate a detected temperature signal, an interface configured to communicate with an external host, a primary controller coupled to the interface and that, when enabled, controls the plurality of circuit modules, and a secondary controller coupled to the interface and that, when enabled, is configured to disable at least a portion of the plurality of circuit modules to reduce heat generation, wherein in response to the detected temperature signal indicating that the temperature of the semiconductor die exceeds a first threshold temperature, the primary controller is configured to enable the secondary controller.

In another aspect, a method of supporting signaling and control of a system-on-a-chip (SoC) beyond a threshold temperature is provided. The method includes controlling a plurality of circuit modules of the SoC using a primary controller of the SoC, monitoring a temperature of the SoC with a temperature sensor of the SoC, determining that the temperature of the SoC exceeds the threshold temperature, and in response to determining that the temperature of the SoC exceeds the threshold temperature, enabling a secondary controller of the SoC using the primary controller and using the secondary controller to disable at least a portion of the plurality of circuit modules to reduce heat generation.

In another aspect, a system-on-a-chip (SoC) is provided. The SoC includes a plurality of circuit modules, a temperature sensor configured to generate a detected temperature signal associated with a junction temperature of the SoC, an interface configured to communicate with an external host, a primary controller that when enabled controls the plurality of circuit modules, and a secondary controller coupled to the interface and that, when enabled, is configured to communicate with the external host through the interface, wherein the SoC is configured such that when the detected temperature signal indicates that the junction temperature is below a threshold temperature, the primary controller is enabled and the secondary controller is disabled.

DETAILED DESCRIPTION

Figure 1:
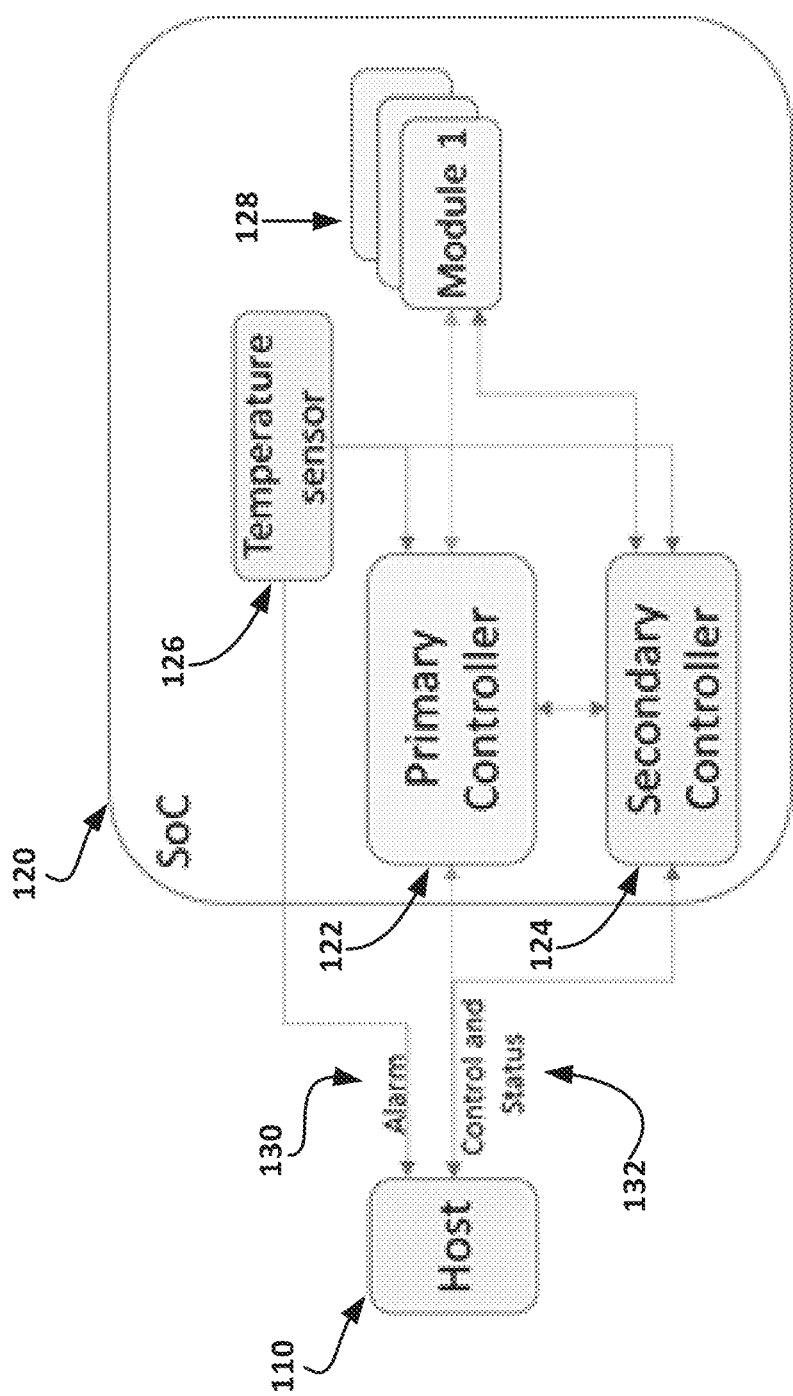
FIG. 1 is a schematic diagram of a host device connected to a system-on-a-chip (SoC) in accordance with one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Semiconductor dies or chips, such as those used in system-on-a-chip (SoC) applications, are designed to operate efficiently when their junction temperature (Tj) is below a maximum design temperature (TDmax) and above a minimum design temperature (TDmin). Semiconductor chips may be manufactured using semiconductor processes that, at least theoretically, enable operation at junction temperatures as high as a maximum process temperature (TPmax). Semiconductor dies and chips may be referred to herein interchangeably and may refer to bare semiconductor dies as well as packaged semiconductor dies, as examples.

However, designing a semiconductor chip to have reliable operation at junction temperatures near the maximum process temperature (TPmax) may be difficult and/or expensive. In particular, at temperatures near the maximum process temperature (TPmax), transistors may draw more current, requiring difficult and/or expensive changes to circuit design and/or layout to compensate for such excess current draw.

For example, at relatively high temperatures, such as 150° C. or more, transistors can have relatively high leakage current or static power dissipation. However, it may be impractical to implement the chip's power grid to support such high leakage current. Moreover, the high leakage current can lead to Ohmic drop (also referred to as I*R drop) that causes transistors closer to the chip's power supply pins to receive a higher power supply voltage than transistors relatively far from the power supply pins. Although the nominal voltage level of the power supply voltage can be increased to compensate for the Ohmic drop, increasing the nominal voltage level in this manner can cause reliability issues (for instance, gate-oxide damage) for transistors closer to the power supply pins and/or circuit inoperability (for instance, errors in digital circuitry driving analog circuitry with a higher voltage).

Thus, developing an entire design of a semiconductor chip to operate at the maximum process temperature may result in overdesign, area inefficiencies, power consumption inefficiencies, and/or other undesirable design characteristics. Therefore, it is generally preferable to design semiconductor chips such as SoCs to have a maximum design temperature (TDmax) that is lower than the maximum process temperature (TPmax). As just one example, a given semiconductor process may have a maximum process temperature (TPmax) of 150° C., whereas a given SoC may be designed with a maximum design temperature (TDmax) of 125° C.

Provided herein are semiconductor chips including multiple controllers for operating over an extended temperature range. In certain embodiments, a semiconductor die includes multiple circuit modules, one or more temperature sensors that generate detected temperature signals, an interface that communicates with an external host, a primary controller coupled to the interface and operable to control the circuit modules, and a secondary controller coupled to the interface.

In certain implementations, in response to one or more detected temperature signals indicating that the temperature of the semiconductor die exceeds a threshold temperature, the primary controller enables the secondary controller, which in turn disables the primary controller and at least a portion of the plurality of circuit modules to reduce heat dissipation. The modules that are turned off by the secondary controller can be hardcoded or programmed by the external host, as examples. The secondary controller communicates status information to the external host over the interface. In response to the detected temperature signal indicating that the temperature of the semiconductor die has dropped below the threshold temperature, the secondary controller enables the primary controller, which in turn disables the secondary controller and restores the plurality of circuit modules to normal operation. In some embodiments, the threshold temperature associated with disabling the primary controller and enabling the secondary controller may be different (e.g., higher or lower) than the threshold temperature associated with enabling the primary controller and disabling the secondary controller.

Thus, a semiconductor chip may be configured to shut down, operate with reduced performance or functionality, and/or take other appropriate action to limit heat generation when a junction temperature of the semiconductor chip exceeds a threshold (e.g., a changeover temperature (TC)).

As examples, the semiconductor chip may shut down one or more circuit modules, may reduce an operating frequency of one or more circuit modules, and/or may take other appropriate actions. The changeover temperature (TC) may be fixed or may be programmable. The changeover temperature (TC) may be at the maximum design temperature (TDmax), may be at a higher temperature, or may be a lower temperature.

FIG. 1 is a schematic diagram of one example of host device 110 connected to a system-on-a-chip (SoC) 120. The SoC 120 of FIG. 1 may be configured to operate with reduced performance, to operate with reduced functionality, to shut down, or to take other appropriate action when a junction temperature of the SoC 120 exceeds a threshold such as a changeover temperature (TC).

As shown in FIG. 1, SoC 120 may include one or more digital controllers such as primary controller 122 and secondary controller 124, one or more temperature sensors 126 that generate one or more detected temperature signals, and a plurality of circuit modules 128.

The primary controller 122 can provide control over the circuit modules 128. In one example, the primary controller 122 provides one or more of the following functions: (i) configuration of the circuit modules 128, (ii) generation of clock signals for the circuit modules 128, (iii) communication with the host 110 over the interface, (iv) biasing of the circuit modules 128, and/or (v) running of diagnostics and/or calibrations of the circuit modules 128.

The secondary controller 124 can also provide control over the circuit modules 128. In one example, the secondary controller provides one or more of the following functions: (i) monitoring of temperature from the temperature sensors 126; (ii) communication with the host 110 over the interface, (iii) turning on/off one or more of the circuit modules 128, and/or (iv) providing configurability to turn on/off one or more of the circuit modules 128. Although examples of control for the primary controller and secondary controller have been provided, other implementations are possible.

In one embodiment, the primary controller 122 is functional for Tj<TDmax (or Tj<TC) and is disabled or turned off (e.g., via clock gating, hibernation, and/or power gating) for Tj>TDmax (or Tj>TC). The secondary controller 124 may be disabled for low Tj (e.g., Tj<TC) and is switched on as Tj nears or rises above TC and continues to operate for TC<Tj<TPmax, in at least some embodiments.

The circuit modules 128 of the SoC 120 may include digital logic circuit modules, analog modules, and mixed analog-digital modules (also referred to herein as mixed-signal modules). Accordingly, in certain implementations, the SoC 120 may be a mixed signal SoC including both analog and digital circuitry. Such analog circuitry can include not only low frequency analog circuitry, but also higher frequency analog circuitry, such as radio frequency circuits.

The circuit modules 128 may be designed for proper operation (e.g., optimized) at junction temperatures below TDmax (Tj<TDmax). At temperatures above TDmax, the performance of the circuit modules 128 may decrease and the power consumption of the circuit modules 128 may increase.

When the junction temperature (Tj) of the SoC 120 rises above a threshold temperature such as the changeover temperature Tc, one or more of the circuit modules 128 of the SoC 120 may be shut down or reconfigured to operate at a lower functionality level in order to reduce heat generation within the SoC 120, allowing the SoC to cool and Tj to fall below Tc. Once the junction temperature Tj falls below Tc (or falls below a second threshold), operation of the SoC 120 with normal performance levels can be restored.

In at least some embodiments, the SoC 120 may be configured to send an alarm signal 130 to an external host 110, such as when the junction temperature Tj of the SoC 120 rises above the threshold temperature Tc. Additionally or alternatively, the SoC 120 may be configured to exchange control commands and status information 132 (e.g., information about the current status of the SoC 120) with the external host 110, both during normal operations and when the SoC is operating at reduced capacity due to overheating.

The alarm signal 130 may be generated by one or more temperature sensors 126 (as illustrated in FIG. 1), by primary controller 122, and/or by secondary controller 124. The control commands 132 may be received by the primary controller 122 from the external host 110 and the status information may be sent by the primary controller 122 to the external host 110 during normal operations.

When the SoC 120 is operating at reduced capacity due to overheating (e.g., Tj>TC), the secondary controller 124 takes over and receives control commands 132 from the external host 110 and send status information 132 to the external host 110. With such arrangements, the primary controller 122 may be shut down when the SoC 120 has a junction temperature above the threshold TC. The control signals and commands 132 received from the external host 110 may be signals that control or configured some or all of the circuit modules 128.

In various embodiments, control signals 132 from external host 110 may be override or change which circuit modules 128 are shut down and/or the performance level of operating circuit modules 128, such as when the SoC 120 is operating at elevated temperatures (e.g., Tj>TC).

In some embodiments, the primary controller 122 and the secondary controller 124 may communicate with the external host 110 over a common interface. In other embodiments, the primary controller 122 and the secondary controller 124 may communicate with the external host 110 over separate communications interfaces. The interface connecting the host device 110 and SoC 120 can be implemented in a wide variety of ways. Examples of interfaces include, but are not limited to, a general purpose input/output (GPIO) bus, an inter-integrated circuit (I2C) bus, a serial peripheral interface (SPI) bus, or other suitable interface.

In certain implementations, the primary controller 122 supports a greater amount of functionality (for instance, full functionality) of the circuit modules 128, while the secondary controller 124 supports only limited functionality of the circuit modules 128. As an example, the secondary controller 124 may only support operation of the circuit modules 128 at reduced performance levels or may only support continued operation of some limited subset of the circuit modules 128 (e.g., while Tj>TC).

The secondary controller 124 may, in various embodiments, be optimized or configured to high temperature operations. As an example, the secondary controller 124 may be designed for operations at junction temperatures as high as the maximum process temperature (TPmax).

In some embodiments, the secondary controller 124 may be relatively basic in design, at least in comparison to the primary controller 122 (e.g., the secondary controller 124 may have significantly less functionality than the primary controller 122). As a result, it is possible to design the secondary controller 124 to operate at these elevated temperatures while suffering less of the various undesirable design characteristics than would result if the primary controller 122 (rather than the secondary controller 124) were designed to operate at such elevated temperatures. In other words, the secondary controller 124 may enable at least limited operation and/or monitoring of the SoC 120 when Tj>TC with relatively little impact on overall design cost.

Figure 2:
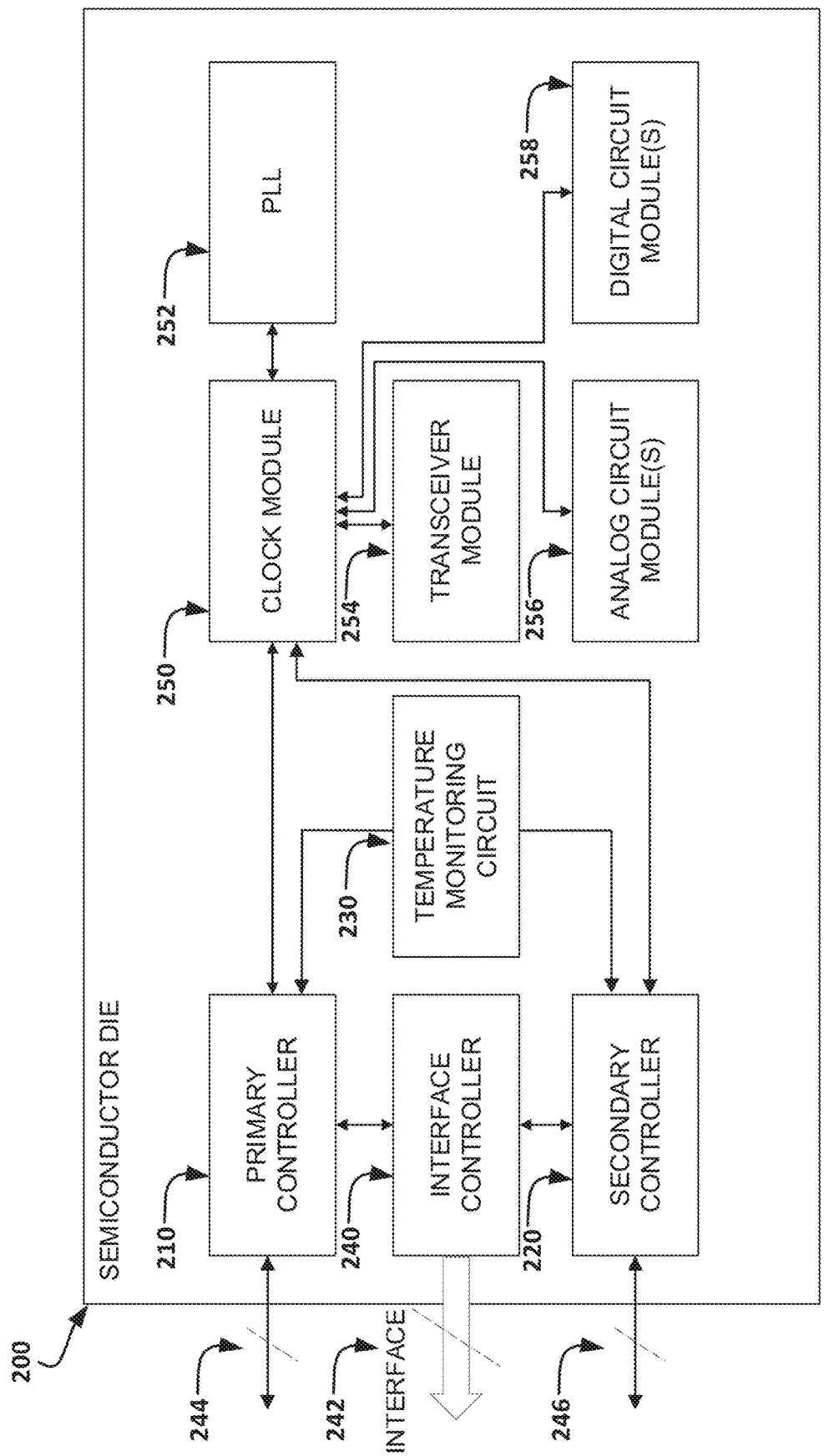
FIG. 2 is a schematic diagram of an electronic system including a primary controller, a secondary controller, a temperature monitoring circuit, and a plurality of circuit modules in accordance with one embodiment.

FIG. 2 shows a more detailed example of an electronic system (implemented as a semiconductor die or chip 200, in this embodiment) that may continue to operate with at least limited functionality when a junction temperature of the die exceeds a threshold. The semiconductor die 200 of FIG. 2 includes a primary controller 210, a secondary controller 220, a temperature monitoring circuit 230, an interface controller 240, and a plurality of circuit modules such as a clock module 250, a phase-locked-loop (PLL) module 252, a transceiver module 254, analog circuit module(s) 256, and digital circuit module(s) 258. The semiconductor die 200 may, as an example, be a system-on-a-chip (SoC), and can correspond to a packaged or unpackaged die.

Although various examples of circuit modules are shown, the teachings herein are applicable to semiconductor chips implemented with a wide range of functionality. Accordingly, other implementations of circuit modules are possible.

In the illustrated embodiment, the primary controller 210 provides control over the circuit modules of the chip 200 including the clock module 250, the PLL module 252, the transceiver module 254, the analog circuit module(s) 256, and/or the digital circuit module(s) 258.

As one example, the primary controller 210 may control the various circuit modules of the chip 200 by controlling the generation and distribution of clock signals by clock module 250. In particular, the primary controller 210 may activate, deactivate, and/or adjust the performance of the various circuit modules (individually and/or collectively) by sending commands or other signals to clock module 250 that direct clock module 250 to generate clock signals that activate, deactivate, and/or adjust the performance of the various circuit modules. For example, the primary controller 210 may command the clock module 250 to reduce the frequency of clock signals for some or all of the circuit modules in order to reduce the performance level or speed of those circuit modules.

As another example, the primary controller 210 may command the clock module 250 to stop generating clock signals and to hold a clock signal at a given level in order to shut off or deactivate some or all of the circuit modules. As yet another example, the primary controller 210 may command a power management circuit to stop providing power signals to some or all of the circuit modules in order to deactivate those circuit modules.

The secondary controller 220 can provide similar control over the circuit modules. As examples, the secondary controller 220 may be able to control circuit modules such as clock module 250 to turn off, deactivate, or reduce the performance of various circuit modules in the semiconductor die 200 including PLL 252, transceiver 254, analog module(s) 256, and digital module(s) 258, as examples. Additionally, the secondary controller 220 may be configured to communicate with external hosts.

With continuing reference to FIG. 2, the secondary controller 220 may provide status information such as current temperatures and which modules are operating and at what capacity to external hosts over the interface 242 (and/or 246), even when the chip's junction temperature exceeds TC and the chip is operating in a reduced configuration. The secondary controller 220 may also receive commands from external hosts such as commands to active the primary controller 210, commands to activate or deactivate one or more circuit modules, and commands to increase or decrease the performance level of one or more circuit modules. With arrangements of this type, external host devices can monitor the SoC through the secondary controller 220 (even in the face of excessive temperatures) and the external host can even turn on or off (or adjust the power consumption and performance levels of) different modules in the chip to reduce heat generation and thus reduce the temperature of the chip. In some embodiments, the secondary controller 220 may be disabled during a power-on sequence of the chip 200.

Temperature monitoring circuit 230 may include one or more sensors, which may be dispersed around the area of the chip 200 (e.g., to obtain readings from different regions of the chip, which may be at different temperatures). In some embodiments, the temperature sensors of the temperature monitoring circuit 230 may be selectively positions near or integrated with high-power components of the chip 200. As an example, if a particular module such as the transceiver module 254 is a relatively high-power module generating relatively more heat than other components, the temperature sensors may be positioned to measure the temperature of the transceiver module 254 (or other high-power module). With arrangements of this type, the temperature monitoring circuit 230 may be sensitive to hot spots within the chip 200, thereby ensuring such hot spots do not exceed desired temperatures without being detected.

The temperature monitoring circuit 230 may determine the junction temperature of the chip 200 and report the temperature to one or more components such as the primary controller 210 and/or the secondary controller 220. In some embodiments, the temperature monitoring circuit 230 reports an average measurement representing an average of a plurality of measurements taken at different locations within the chip 200. In other embodiments, the temperature monitoring circuit 230 reports the highest measurement. In still other embodiments, the temperature monitoring circuit 230 reports readings from multiple temperature sensors.

Interface controller 240 may be configured to facilitate communication over communications interface 242 between an external host (such as host 110 of FIG. 1) and components of the chip 200 such as primary controller 210 and secondary controller 220. In at least some embodiments, chip 200 may include an additional interface 244 between primary controller 210 and an external device and/or may include an additional interface 246 between secondary controller 220 and an external device. The interfaces 242, 244, and 246 can be implemented in a wide variety of ways. Examples of interfaces include, but are not limited to, a general purpose input/output (GPIO) bus, an inter-integrated circuit (I2C) bus, a serial peripheral interface (SPI) bus, or other suitable interface.

Clock module 250 may generate clock signals used by other component in the chip 200. As an example, clock module 250 may generate clock signals that effectively control operation of the transceiver module 254, the analog circuit module(s) 256, and the digital circuit module(s) 258.

By varying the frequency of the clock signals, the clock module 250 may be able to adjust the performance or functionality of the circuit modules in chip 200 (e.g., higher frequency clock rates tend to be associated with higher performance or functionality in circuits). Similarly, by stopping clock signals and holding a clock signal at a particular voltage (e.g., logic high or logic low, which may be ground), the clock module 250 may be able to effective deactivate or shut done some or all of the circuit modules. In at least some embodiments, phased-locked loop (PLL) module 252 may generate clock signals at the direction of clock module 250.

Transceiver module 254 may be a transceiver used in processing signals for transmission and/or reception. The signals may include any desired type of signals including radio-frequency signals, ultrasonic signals, radar, infrared signals, laser and/or light signals including, but not limited to, LIDAR signals. In at least some embodiments, transceiver module 254 may be a relatively high-power circuit module. In particular, transceiver module 254 may generate relatively high power light and/or laser signals for used in a LIDAR system and, as such, may generate a significant amount of heat during operation.

Analog and digital circuit module(s) 256 and 258 may include various analog circuits, various digital circuits, and also various hybrid circuits including both analog and digital components. As examples, these modules may include analog-to-digital converters (ADCs), digital-to-analog converters (DACs), transceivers, RF circuitry, processors, digital logic, power supply circuitry, signal and/or power amplifiers, and other such digital, analog, and hybrid circuits.

As discussed above, a semiconductor chip such as semiconductor chip 120 of FIG. 1 and semiconductor chip 200 of FIG. 2 may continue to operate with at least limited functionality when its junction temperature exceeds a threshold.

Figure 3A:
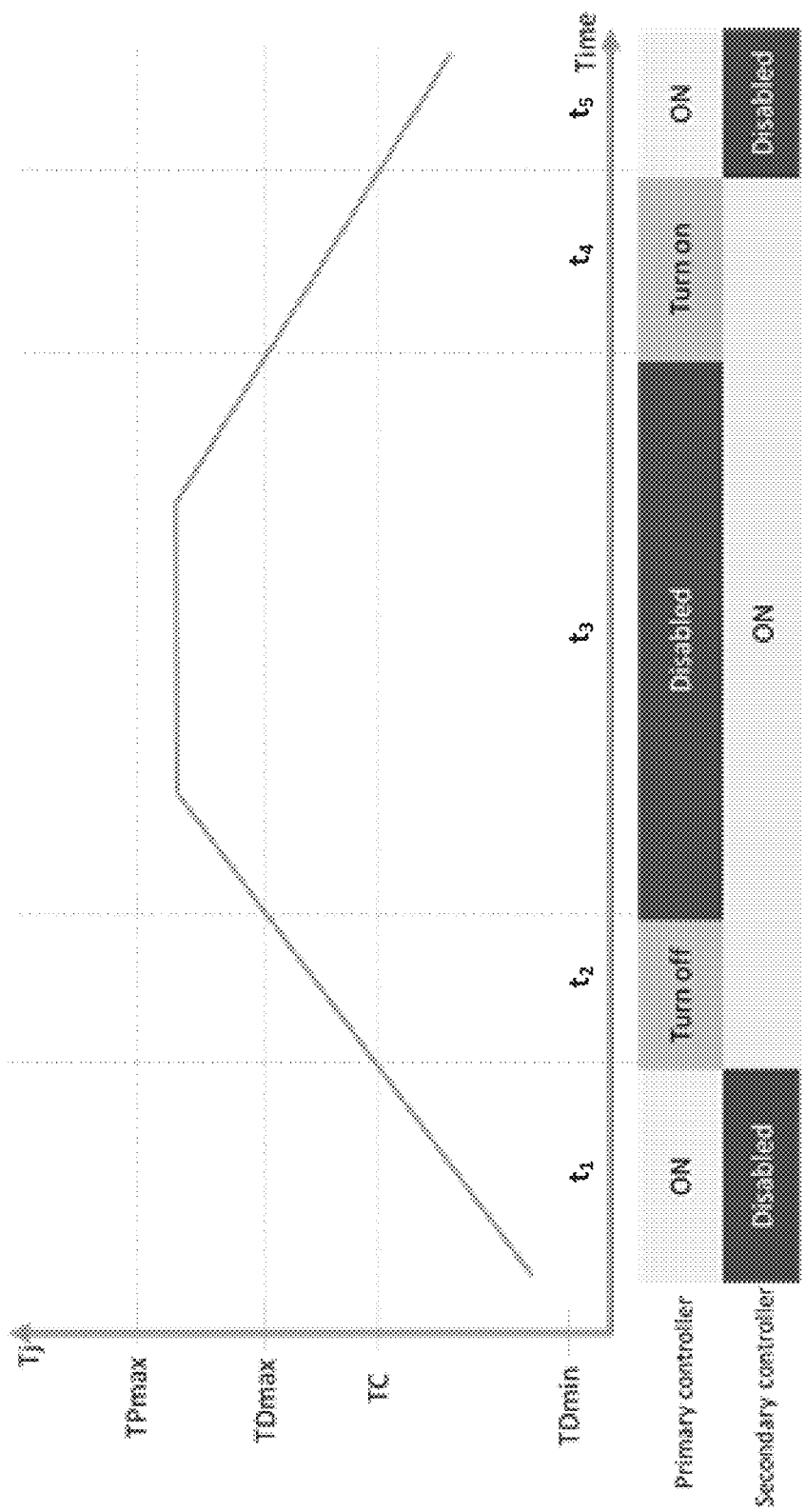
FIGS. 3A, 3B, and 3C are graphs of controller states versus temperature according to various embodiments.

FIG. 3A illustrates one embodiment of how various components may change operating state with variations in temperature of the chip.

At time $t_1$, the junction temperature of the semiconductor chips 120, 200 is below a threshold temperature TC. The junction temperature may be measured by temperature monitoring circuit 230. Because the junction temperature is lower than the threshold temperature TC, the chips 120, 200 may be configured for normal operations. As a particular example, the primary controller 122, 210 may be active and the secondary controller 124, 220 may be disabled and/or shut down (to reduce power consumption). Additionally, the various circuit modules of the chip may be operating normally.

At time $t_2$, the chip may detect a junction temperature in excess of the threshold temperature TC, e.g., as measuring by temperature monitoring circuit 230. As a result, an alarm or other flag may be raised. The alarm may be raised by the temperature monitoring circuit 230, by the primary controller 210, or by any other suitable component. The alarm may act as (or be accompanied by) an interrupt to the primary controller 210. The interrupt may trigger or command the primary controller 210 to turn on the secondary controller 220.

In certain implementations, the primary controller 210 may also turn off one or more of the circuit modules of the chip (e.g., by commanding clock module 250 to stop generate clock signals, reduce the frequency of clock signals, or by taking other appropriate action). In other embodiments, the secondary controller 220 may be responsible for turning off circuit modules of the chip. If desired, the secondary controller 220 may turn off the primary controller 210. In such embodiments, the chip 200 may communicate with external hosts via the secondary controller 220.

By turning off or reducing the performance of one or more circuit modules, the chip may be able to reduce heat generation within the chip, avoid further overheating, and allow the chip to cool off to temperatures that are lower than the threshold temperature TC (or the maximum design temperature TDmax).

At time $t_3$, the chip may detect a junction temperature in excess of the maximum design temperature TDmax. The primary controller 210 may remain disabled, while the secondary controller 220 remains active. In this manner, the chip may continue to communicate with external hosts via the secondary controller 220. In contrast, chips lacking the capability to operate beyond the maximum design temperature TDmax may go silent from the perspective of the external hosts, which may be undesirable. With the present invention, the chip may remain in communication with the external hosts, even when the junction temperature of the chip exceeds the maximum design temperature TDmax for which the majority of the chip was designed.

At time $t_4$, the chip may detect that the junction temperature has dropped below the maximum design temperature TDmax. In some embodiments, the chip may wait until the junction temperature drops below the threshold temperature TC to begin restoring functionality. In other embodiments, the chip may turn on the primary controller 210 at time $t_4$ in anticipation of further temperature decreases (then, when the temperature drops below TC, the primary controller may shut down the secondary controller and restore the chip's modules to normal operation).

At time $t_5$, the chip may detect that the junction temperature has dropped below the threshold temperature TC, e.g., as measuring by temperature monitoring circuit 230. The temperature may drop to various factors, including the shutdown of the primary controller 210, the deactivation of one or more circuit modules, and/or the reduction in performance of one or more circuit modules that occurred at time $t_2$. At time $t_5$, the secondary controller 220 may turn the primary controller 210 back on. The primary controller 210 (or the secondary controller 220) may restore the chip to normal operations and/or functionality. As an example, the primary controller 210 may active any disabled circuit modules and may restore any circuit modules that were operating at limited functionality or speeds to their normal configurations. The primary controller 210 may also turn off the secondary controller 220, or the secondary controller 220 may turn itself off.

Figure 3B:
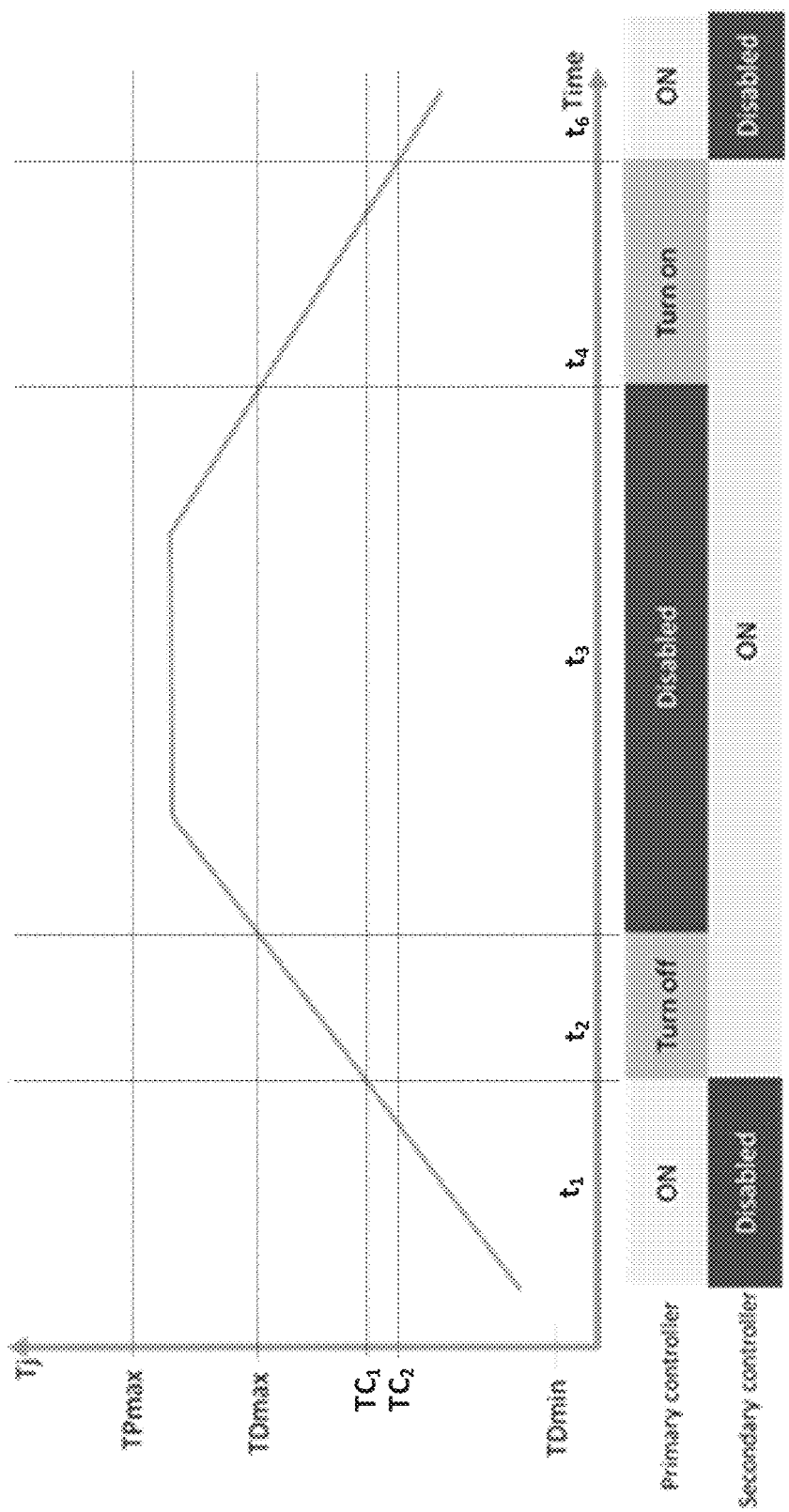
Figure 3C:
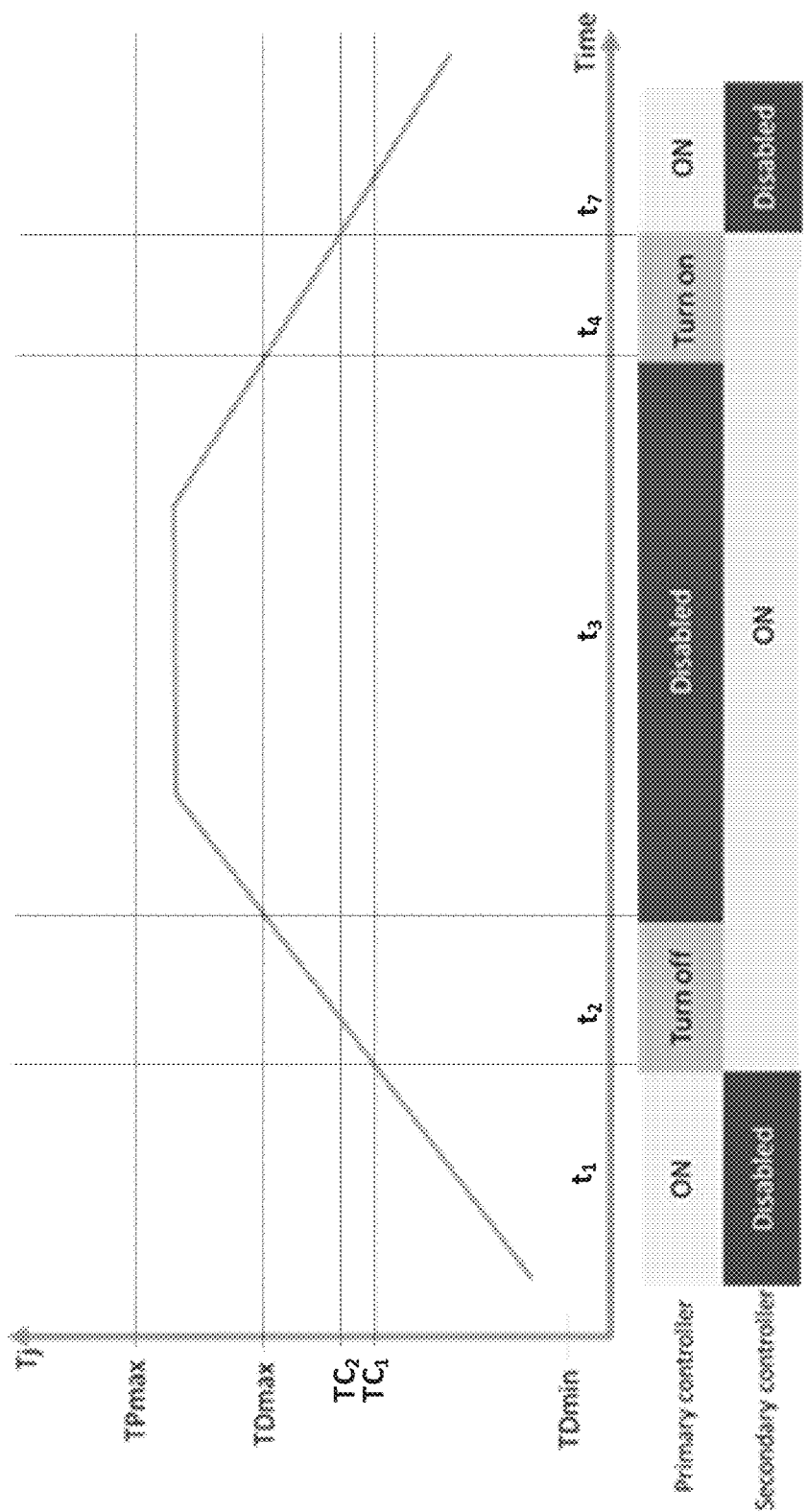

As illustrated in FIGS. 3B and 3C, there may be multiple threshold temperatures such as threshold temperatures $TC_1$ and $TC_2$ (e.g., there may be a rising threshold temperature $TC_1$ and a falling threshold temperature $TC_2$). When the junction temperature of the semiconductor chip (such as semiconductor die 120, 200) exceeds the rising threshold temperature $TC_1$, an alarm or flag may be raised and the primary controller 210 may turn on the secondary controller 220. When the junction temperature of the semiconductor chip falls below the falling threshold $TC_2$, the primary controller 210 (or secondary controller 220) may restore the chip to normal operations and/or functionality.

In the embodiment of FIG. 3B, the rising threshold temperature $TC_1$ is greater than the falling threshold temperature $TC_2$, such that the chip continues to cool off until time $t_6$ and may be less likely to quickly overheat and exceed the rising threshold temperature $TC_1$ after normal operations are restored. In the embodiment of FIG. 3C, the rising threshold temperature $TC_1$ is less than the falling threshold temperature $TC_2$, such that the chip restores normal operations somewhat faster, at time $t_7$ and/or disables normal operations somewhat sooner.

In the FIG. 3C embodiment, the semiconductor chip may permit normal operations above the rising threshold temperature $TC_1$ for a limited period of time (e.g., until the chip cools off to below the falling threshold temperature $TC_2$, until a predetermined or dynamically-determined period of time has elapsed, until the chip exceeds the falling threshold temperature $TC_2$, etc.).

Figure 4:
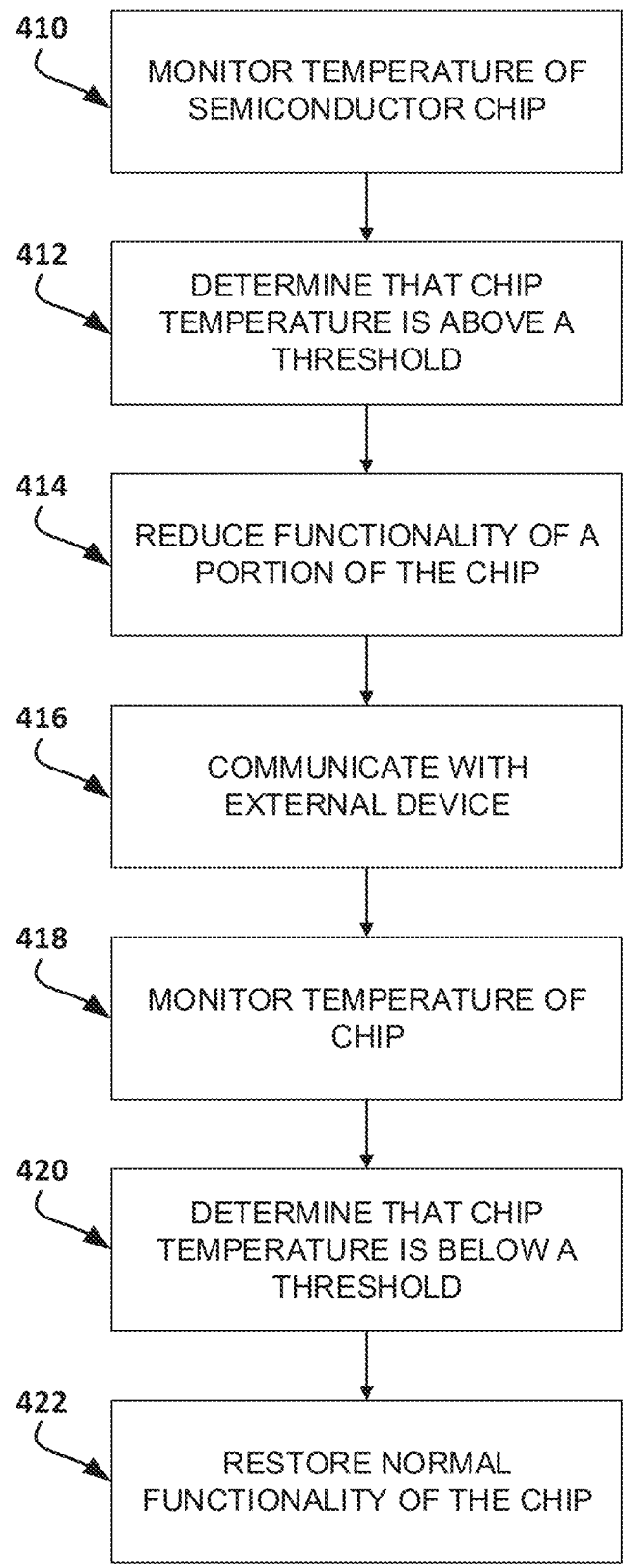
FIG. 4 is a flow diagram of a process for reducing heat generation in a semiconductor chip and supporting signalling with the semiconductor chip when chip temperatures exceed a threshold according to an embodiment.

FIG. 4 is one example of a process for reducing heat generation in a chip and supporting signalling with the chip when chip temperatures exceed a design threshold. The process of FIG. 4 may be performed by various electronic circuitry such as the external host 110 of FIG. 1, the SoC 120 of FIG. 1, and/or the semiconductor semiconductor 200 of FIG. 2.

At step 410, a temperature of a semiconductor chip, such as semiconductor chip 120 of FIG. 1 and/or semiconductor chip 200 of FIG. 2, is monitored. As an example, a temperature sensing circuit such as circuit 126 or 230 may monitor one or more junction temperatures of the semiconductor chip (e.g., at one or more positions within the semiconductor chip).

In some embodiments, step 410 may include a controller such as primary controller 122 or 210 monitoring the temperature of the semiconductor chip. If desired, an external host such as host 110 may monitor the temperature of the semiconductor chip at step 410. In at least some embodiments, the semiconductor chip may monitor its temperature throughout the each of the steps of FIG. 4.

At step 412, it may be determined that the chip temperature (e.g., a junction temperature in the chip) has exceeded a threshold. The threshold may be predetermined, may be dynamically determined, may be user programmable, and/or may be configured by a designer of the semiconductor chip. As two examples, the threshold may be the changeover temperature (TC) or the maximum design temperature (TDmax), both of which are described in further detail herein.

In some embodiments, the temperature sensing circuit 126 or 230 determines that the chip's junction temperature has exceeded the threshold and may respond by sending an alarm or interrupt to other components such as a primary controller, a secondary controller, and/or an external host. In some other embodiments, another component such as the primary controller and/or the external host may determine that the chip's junction temperature has exceeded the threshold (e.g., based on temperature readings from the temperature sensing circuit).

At step 414 and in response to determining that the chip has exceeded the temperature threshold in step 412, the functionality of at least a portion of the semiconductor chip may be reduced (e.g., in order to reduce heat generation and thereby cool off the semiconductor chip).

As an example, the primary controller 210 may be deactivated, the secondary controller 220 may be activated, and one or more additional circuit modules may be disabled, deactivated, powered-down, and/or operated as a reduced level of performance and/or functionality. As a particular example, the secondary controller (or the primary controller, before it shuts down) may command the clock module 250 to stop generating clock signals for at least one of the circuit modules 254, 256, and 258. As another particular example, the secondary controller may command the clock module 250 to reduce the frequency of clock signals it generates and provides to other circuit modules, such that those other circuit modules operate at a reduced performance level and/or with reduced functionality. In at least some embodiment, digital circuit module(s) 258 may consume less power and produce less heat when operating at lower clock frequencies.

Thus, commanding clock module 250 to reduce the clock frequency may result in an overall reduction in power consumption and heat generation by the semiconductor chip. Additional details on how the functionality of the chip may be reduced while the chip is overheated as described in connection with FIGS. 1-3.

At step 416, the semiconductor chip may communicate with external circuitry. As an example, the secondary controller 220 may communicate, via interface 242 and/or 246, with an external host. The secondary controller 220 may send the external host status information, including, but not limited to, current temperature(s) of the semiconductor chip, temperature history of the semiconductor chip, status information on one or more of the circuit modules (e.g., such as modules 250, 252, 254, 256, and 258) including whether the modules are enabled, disabled, and current performance level (e.g., current operating frequency, whether any subcomponents of the circuit modules are disabled, what features of the modules are available and unavailable, etc.).

Additionally, the secondary controller 220 may receive commands from the external host. As examples, the secondary controller 220 may receive commands to re-active the primary controller, to shut down additional circuit modules, to activate one or more circuit modules, to adjust the clock frequency of one or more circuit modules, to shut down the secondary controller, etc.

At step 418, the semiconductor chip may continue to monitor its temperature (e.g., its junction temperature).

At step 420, the semiconductor chip (an/or the external host) may determine that the temperature of the semiconductor chip has dropped below a threshold. The threshold of step 420 may be the same as the threshold of step 412, or may be a separate threshold that is higher or lower than the threshold of step 412.

At step 422 and in response to determining that the chip temperature has dropped below the threshold of step 420, the functionality of the semiconductor chip may be restored to normal. As examples, the secondary controller 220 may activate the primary controller 210, the secondary controller 220 may be shut down (by itself or by the primary controller 210), any previously disabled circuit modules may be reactivated, and any circuit modules operating at reduced capacity or functionality may be restored to normal functionality.

Figure 5:
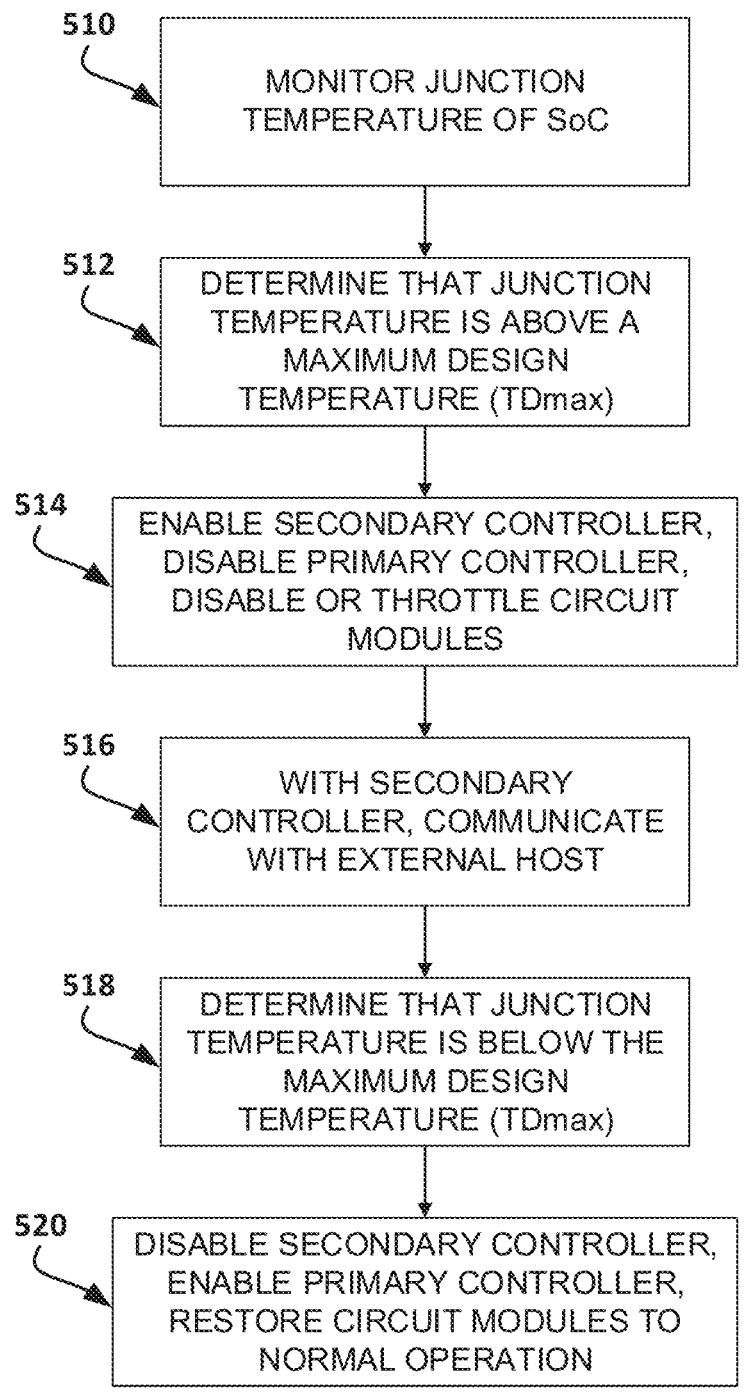
FIG. 5 is a flow diagram of a process for reducing heat generation in a semiconductor chip and supporting signalling with the semiconductor chip when chip temperatures exceed a maximum design temperature according to an embodiment.

FIG. 5 is one example of a process for reducing heat generation in a chip and supporting signalling with the chip when chip temperatures exceed a maximum design temperature. The process of FIG. 5 may be performed by various electronic circuitry such as the external host 110 of FIG. 1, the SoC 120 of FIG. 1, and/or the semiconductor chip 200 of FIG. 2.

At step 510, chip 200 may monitor its junction temperature. As an example, one or more temperature sensors in temperature monitoring circuit 230 may monitor the junction temperature of the SoC at one or more positions.

At step 512, chip 200 may determine that its junction temperature is above a maximum design temperature (TDmax). In some other embodiments, step 512 may involve the chip 200 determining that its junction temperature is above a changeover temperature (TC), which may be lower than the maximum design temperature TDmax. Step 512 may be performed by a temperature monitoring circuit such as circuit 230, by an active controller such as primary controller 210, or by an external host.

At step 514, chip 200 may enable the secondary controller 220, disable the primary controller 210, and disable or throttle one or more of the circuit modules 250, 252, 254, 256, and 258 (and any other circuit modules in the chip that can be disabled or throttled). In some embodiments, an interrupt generated by temperature monitoring circuit 230 upon detection of a function temperature above the threshold (TDmax or TC) may interrupt operation of the primary controller 210 and cause primary controller to shut down one or more of the circuit modules and active the secondary controller 220. Subsequently, the secondary controller 220 may shut down the primary controller 210. One or more external interfaces, such as interface 242, may remain active.

At step 516, the secondary controller 220 may communication with an external host, such as host 110 of FIG. 1. The secondary controller 220 may exchange status information about the chip 200 with the external host including the temperature of the chip and the statuses of the various circuit modules of the chip. In some embodiments, the secondary controller 220 may also receive, and then act upon, commands received from the external host including, but not limited to, commands to shut down additional circuit modules, commands to reactivate one or more circuit modules, commands to adjust clock signals, etc.

At step 518, chip 200 may determine that its junction temperature is below the maximum design temperature TDmax. In some other embodiments, step 516 may involve the chip 200 determining that its junction temperature is below the changeover temperature TC. Step 518 may be performed by a temperature monitoring circuit such as circuit 230, by an active controller such as secondary controller 220, or by an external host.

At step 520, the chip 200 may be returned to normal operations based on the determination, in step 516, that the chip is below the TDmax (or below TC). As examples, the primary controller 210 may be activated, the secondary controller 220 may be deactivated, any circuit modules that were deactivated may be re-activated, any clock signals that were reduced in frequency may be restored to normal frequency, etc.

The proposed architecture described herein enables protection of circuitry from damage when a junction temperature Tj exceeds a maximum design temperature TDmax. The semiconductor chips herein can be used in a wide range of applications, including, but not limited to, radio frequency communications, radar, industrial, instrumentation, energy, healthcare, control, diagnostic, and/or a wide range of other applications. Although one example of controller states versus temperature are shown, other implementations are possible Semiconductor chips employing the above-described schemes can be implemented into various electronic devices. Examples of the electronic devices can include, but are not limited to, consumer electronic products, parts of the consumer electronic products, electronic test equipment, communication infrastructure applications, etc. Further, the electronic device can include unfinished products, including those for communication, industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A semiconductor die supporting signaling and control over a wide temperature range, the semiconductor die comprising:
   a plurality of circuit modules;
   a temperature sensor configured to generate a detected temperature signal;
   an interface configured to communicate with an external host;
   a primary controller coupled to the interface and that, when enabled, controls the plurality of circuit modules; and
   a secondary controller coupled to the interface and that, when enabled, is configured to disable at least a portion of the plurality of circuit modules to reduce heat generation,
   wherein in response to the detected temperature signal indicating that the temperature of the semiconductor die exceeds a first threshold temperature, the primary controller is configured to enable the secondary controller and the secondary controller is further configured to disable the primary controller.

2. The semiconductor die of claim 1, wherein the secondary controller is configured to enable the primary controller in response to the detected temperature signal indicating that the temperature of the semiconductor die is below a second threshold temperature.

3. The semiconductor die of claim 1, further comprising a clock module configured to generate one or more clock signals that control timing of the plurality of circuit modules, wherein the primary controller is further configured to shut down the clock module in response to the detected temperature signal indicating that the temperature of the semiconductor die exceeds the first threshold temperature.

4. The semiconductor die of claim 1, wherein the secondary controller is further configured to communicate a status of the semiconductor die to the external host via the interface while the primary controller is disabled.

5. The semiconductor die of claim 1, wherein the secondary controller has a smaller circuit area on the semiconductor die than the primary controller.

6. The semiconductor die of claim 1, wherein the secondary controller is further configured to operate in a disabled state during a power-on sequence of the semiconductor die.

7. The semiconductor die of claim 1, wherein the plurality of circuit modules include a clock generation module configured to generate a clock signal and a digital logic circuit module configured to operate based on the clock signal, wherein the clock generation module is configured to decrease a frequency of the clock signal in response to the detected temperature signal indicating that the temperature of the semiconductor die exceeds the first threshold temperature.

8. The semiconductor die of claim 1, wherein the secondary controller is configured to disable the at least a portion of the plurality of circuit modules by gating a clock signal.

9. The semiconductor die of claim 1, wherein the plurality of circuit modules include a clock generation module configured to generate a clock signal and a digital logic circuit module configured to operate based on the clock signal, wherein the clock module is operable to shut down in response to the detected temperature signal indicating that the temperature of the semiconductor die exceeds the first threshold temperature.

10. A method of supporting signaling and control of a system-on-a-chip (SoC) beyond a threshold temperature, the method comprising:
    controlling a plurality of circuit modules of the SoC using a primary controller of the SoC;
    monitoring a temperature of the SoC with a temperature sensor of the SoC;
    determining that the temperature of the SoC exceeds the threshold temperature; and
    in response to determining that the temperature of the SoC exceeds the threshold temperature, enabling a secondary controller of the SoC using the primary controller and using the secondary controller to disable the primary controller and at least a portion of the plurality of circuit modules to reduce heat generation.

11. The method of claim 10, further comprising sending status information of the SoC to an external host over an interface while the primary controller and the plurality of circuit modules are disabled.

12. The method of claim 10, further comprising using the secondary controller to receive a control command from the external host over the interface while the primary controller and at least the portion of the plurality of circuit modules are disabled, and changing a number of disabled circuit modules in response to the received control command.

13. The method of claim 10, wherein determining that the temperature of the SoC exceeds the threshold temperature comprises sending an interrupt to the primary controller using a temperature monitoring circuit coupled to the temperature sensor.

14. The method of claim 10, further comprising:
    determining that the temperature of the SoC has dropped below the threshold temperature using the second controller; and
    in response to determining that the temperature of the SoC has dropped below the threshold temperature, enabling the primary controller and enabling at least some of the disabled portion of the plurality of circuit modules using the secondary controller.

15. The method of claim 10, wherein the threshold temperature comprises a maximum design temperature and wherein one or more of the circuit modules are configured for operation only below the maximum design temperature.

16. The method of claim 10, further comprising disabling the at least a portion of the plurality of circuit modules by gating a clock signal using the secondary controller.

17. The method of claim 10, further comprising generating a clock signal for a digital logic circuit module using a clock generation module, and shutting down the clock generation module in response to determining that the temperature of the SoC exceeds the threshold temperature.

18. A system-on-a-chip (SoC), comprising:
    a plurality of circuit modules comprising a clock module that generates a clock signal used by at least one other circuit module in the SoC;
    a temperature sensor configured to generate a detected temperature signal associated with a junction temperature of the SoC;
    an interface configured to communicate with an external host;

a primary controller that when enabled controls the plurality of circuit modules; and a secondary controller coupled to the interface and that, when enabled, is configured to communicate with the external host through the interface, wherein the SoC is configured such that when the detected temperature signal indicates that the junction temperature is below a threshold temperature, the primary controller is enabled and the secondary controller is disabled, and wherein, in response to the detected temperature signal indicating that the junction temperature exceeds the threshold temperature, the primary controller is configured to disable at least one of the circuit modules by commanding the clock module to stop generating the clock signal.

19. The SoC of claim 18, wherein the circuit modules comprise a transceiver module that is disabled by the primary controller in response to the detected temperature signal indicating that the junction temperature exceeds the threshold temperature.

20. The SoC of claim 18, wherein in response to the detected temperature signal indicating that the junction temperature exceeds the threshold temperature, the primary controller is configured to enable the secondary controller.

* * * * *